United States Patent [19]

Landes

[11] Patent Number: 4,696,425

[45] Date of Patent: Sep. 29, 1987

[54] PROGRAMMABLE ULTRASONIC POWER SUPPLY

[75] Inventor: James L. Landes, Plano, Tex.

[73] Assignee: Texas Instruments Incorporated, Dallas, Tex.

[21] Appl. No.: 631,658

[22] Filed: Jul. 17, 1984

[51] Int. Cl.$^4$ .................... B23K 1/06; B23K 20/10
[52] U.S. Cl. .................... 228/1.1; 228/4.5; 228/102; 228/110; 310/317; 323/212; 156/351
[58] Field of Search .................... 228/4.5, 1.1, 7, 4.1, 228/102, 110; 323/205, 212, 213; 156/73.1, 351; 264/23; 310/316, 317

[56] References Cited

U.S. PATENT DOCUMENTS

| | | | |
|---|---|---|---|
| 3,868,698 | 2/1975 | Dressler | 310/317 |
| 4,040,885 | 8/1977 | Hight et al. | 228/110 |
| 4,044,297 | 8/1977 | Nobue et al. | 310/317 |
| 4,047,992 | 9/1977 | Williams et al. | 156/351 |
| 4,056,761 | 11/1977 | Jacoby et al. | 310/317 |
| 4,197,478 | 4/1980 | Silvus, Jr. | 310/317 |
| 4,341,574 | 7/1982 | Landes | 228/110 |
| 4,371,816 | 2/1983 | Wieser | 310/317 |
| 4,409,659 | 10/1983 | Devine | 228/1.1 |
| 4,438,880 | 3/1984 | Smith et al. | 228/1.1 |
| 4,606,490 | 8/1986 | Chan et al. | 228/103 |

FOREIGN PATENT DOCUMENTS

| | | | |
|---|---|---|---|
| 156880 | 9/1982 | Japan | 228/102 |
| 318441 | 12/1971 | U.S.S.R. | 228/110 |
| 647086 | 2/1979 | U.S.S.R. | 228/110 |
| 781000 | 11/1980 | U.S.S.R. | 228/1.1 |
| 880667 | 11/1981 | U.S.S.R. | 228/1.1 |

Primary Examiner—Nicholas P. Godici
Assistant Examiner—Samuel M. Heinrich
Attorney, Agent, or Firm—Frederick J. Telecky, Jr.; James T. Comfort; Melvin Sharp

[57] ABSTRACT

An ultrasonic generator for providing power to a bonding apparatus having a bonding horn which is brought into contact with respective conductive pads and which carries a wire to be dispensed for interconnection therebetween includes a circuit for applying a voltage at an ultrasonic frequency to the bonding horn to produce a bonding current in the horn, and a monitor for monitoring the bonding current applied to the bonding horn. A circuit is provided for maintaining a zero phase difference between the applied voltage and the monitored current. In addition, a circuit is provided for continuously monitoring and controlling the current which is delivered to the bonding horn to produce a current waveform of a predetermined controllable pattern.

19 Claims, 25 Drawing Figures

PROGRAMMABLE ULTRASONIC POWER SUPPLY

BACKGROUND OF THE INVENTION

1. Field of the Invention

This invention relates to improvements in ultrasonic power supplies, and, more particularly, to improvements in ultrasonic power supplies of the type used for forming ball and stitch bonds in attaching wire leads between integrated circuit chips and carrier lead frames in the manufacture of integrated circuit devices.

2. Description of the Prior Art

At one stage during the fabrication of integrated circuit devices, wire leads are attached between contact points on an integrated circuit chip and a corresponding wire lead on a lead film or frame upon which the chip is carried. This is usually accomplished by a bonder which automatically locates a pad or point on the integrated circuit chip to which connection is to be made and brings a wire dispensing horn into contact with it. During the process, a small amount of wire material from which the lead is to be constructed is dispensed, and is melted by a torch, forming a ball. A measured amount of ultrasonic power is applied to the horn. This power causes the dispensed wire lead to bond to the integrated circuit, referred to in the art as a ball bond. Thereafter, an additional amount of wire is dispensed as the horn is moved to a location on the lead film upon which the circuit is carried. The lead is then bonded to the lead film, but the form of the bond is accomplished by transversly attaching the wire along its length to the foil lead with a so-called "stitch bond."

In the past, both ball bonds and stitch bonds were accomplished by applying to the wire dispensing horn a predetermined power pulse having voltage and current waveforms generally as shown in FIGS. 1 and 2. The envelope form of a typical voltage with respect to time at a typical frequency of, for instance, 62.5 kHz is shown in FIG. 1, and the envelope of the current produced in the horn during the bonding process with respect to time is shown in FIG. 2.

The bonding horns themselves generally include a piezoelectric device having an extremely high Q, and typical prior ultrasonic power supplies used with such bonding devices are programamble only in respect to time and peak to peak power. Thus, as shown, the voltage waveform applied is practically of a squared envelope pattern representing, in essence, merely the turning on and turning off the applied voltage. The particular frequency applied is specifically tuned to the extremely high Q piezoelectric horn device used. It can be seen that the current waveform is of a generally decaying nature, as opposed to the voltage waveform. This is because as the bond is being completed, the impedance of the bond function changes, thereby affecting the current waveform. The particular current waveform produced in uncontrolled, and, the waveform illustrated is merely one example of the numerous waveforms which might appear, depending upon many factors, as is known in the art.

Typical prior art bonders include separate means for controlling the voltage for different particular type bonds. For instance, some bonding apparatuses include a first program channel to set the parameters for effecting ball bonds and a second programmable channel for effecting stitch bonds. Thus, the amplitude and the time duration of each voltage pulse having the envelope waveform of FIG. 1 are individually adjusted depending upon the average parameters anticipated to be encountered in the bonding process. Thus, the applied power pulse typically can be adjusted manually, or, in some case, by preprogramming the amplitude desired, especially for a particular location or bond. This results in bonds of not optimum quality; in fact, sometimes, for instance, in the formation of stitch bonds, either an insufficient amount of power is applied, or, conversely, too much power is applied causing the bond to either be malformed or burned completely through. Additionally, the control of the power to the horn is uncontrolled once it is turned on until the time that it is turned off, resulting in the bond being as it fortuitously results.

In the attachment of the wire leads to the integrated circuit package, depending upon the orientation of the integrated circuit chip, which may not be the same from chip to chip, or from location to location, oftentimes prior apparatuses sense the contact between the lead carrying horn and the chip by pressure sensitive means, which, once touchdown is sensed, sometimes results in the horn having been pressed too hard into the substrate to form an effective bond.

It has been proposed to monitor the formation of wire bonds in real time in ultrasonic microelectronic wire-bonding processes. For example, M. McBrearty et al, "REAL TIME NODESTRUCTIVE EVALUATION IN ULTRASONIC WIRE BONDING" published by Kulicke and Soffa Industries, Inc., Horsham, Pa. have proposed devleoping a signature of attempted wire bonds and assigning a grade to the signatures. Those bonds with a particular signature for low grade are then used to indicate either poor bonds or bonds attempted without wire.

SUMMARY OF THE INVENTION

In light of the above, it is, therefore, an object of the invention to provide a programmable ultrasonic power supply for use in fabricating integrated circuit devices, and, more particularly, in forming wire leads between the integrated circuit chip and its underlying lead film.

It is another object of the invention to provide a programmable ultrasonic power supply of the type described which can be separately programmed for forming different types of bonds to optimize the power level required for each type bond.

It is another object of the invention to provide a programmable ultrasonic power supply of the type described in which the power amplitude can be varied during the formation of a bond to achieve a desirable and reliable bond.

It is another object of the invention to provide a programmable ultrasonic power supply of the type described in which the current and voltage can be analyzed in real time to dynamically monitor the bond impedance as it is being formed, and to thereby monitor the condition of the bond, when it is done, and the characteristics of the bond.

It is another object of the invention to provide a programmable ultrasonic power supply of the type described which can detect errors in the bonds from variations of experienced norms as the bonds are being formed.

It is still another object of the invention to provide a programmable ultrasonic power supply of the type described which results in better ball bond seating than accomplished heretofore by prior art devices.

It is another object of the invention to provide a programmable ultrasonic power supply of the type described which is self tuning to the frequency of the ultrasonic horn of the bonder.

It is still another object of the invention to provide a programmable ultrasonic power supply of the type described which can detect or sense the touchdown of the horn onto the substrate to which bonds are to be made using current variation for greater touchdown sensitivity than heretofore realized.

It is still another object of the invention to provide an ultrasonic power supply of the type described which has a reduced time required to tune the frequency of the ultrasonic power applied to the horn.

These and other objects, features and advantages will become apparent to those skilled in the art from the following detailed description when read in conjunction with the accompanying drawings and appended claims.

In accordance with a broad aspect of this invention, an ultrasonic generator is provided for providing power to a bonding apparatus. The generator includes a software bond monitor function by which a real time control of the bond energy waveshape and time are monitored and controlled. Means controlled by the software bond monitor are provided for controlling the relative bond power to individual bonds as they are being made to monitor the integrity of the bonds as they are being formed. Additionally provided is a current sensing circuit which dynamically and automatically tunes the resonant frequency of the power applied to the bonding horn, despite changes in impedance experienced at the bond junction as it is being formed.

BRIEF DESCRIPTION OF THE DRAWING

The invention as illustrated in the accompanying drawings in which.

In the various figures of the drawing, like reference numerals are used to denote like or similar parts.

DETAILED DESCRIPTION OF THE PREFERRED EMBODIMENT

Figure 3:
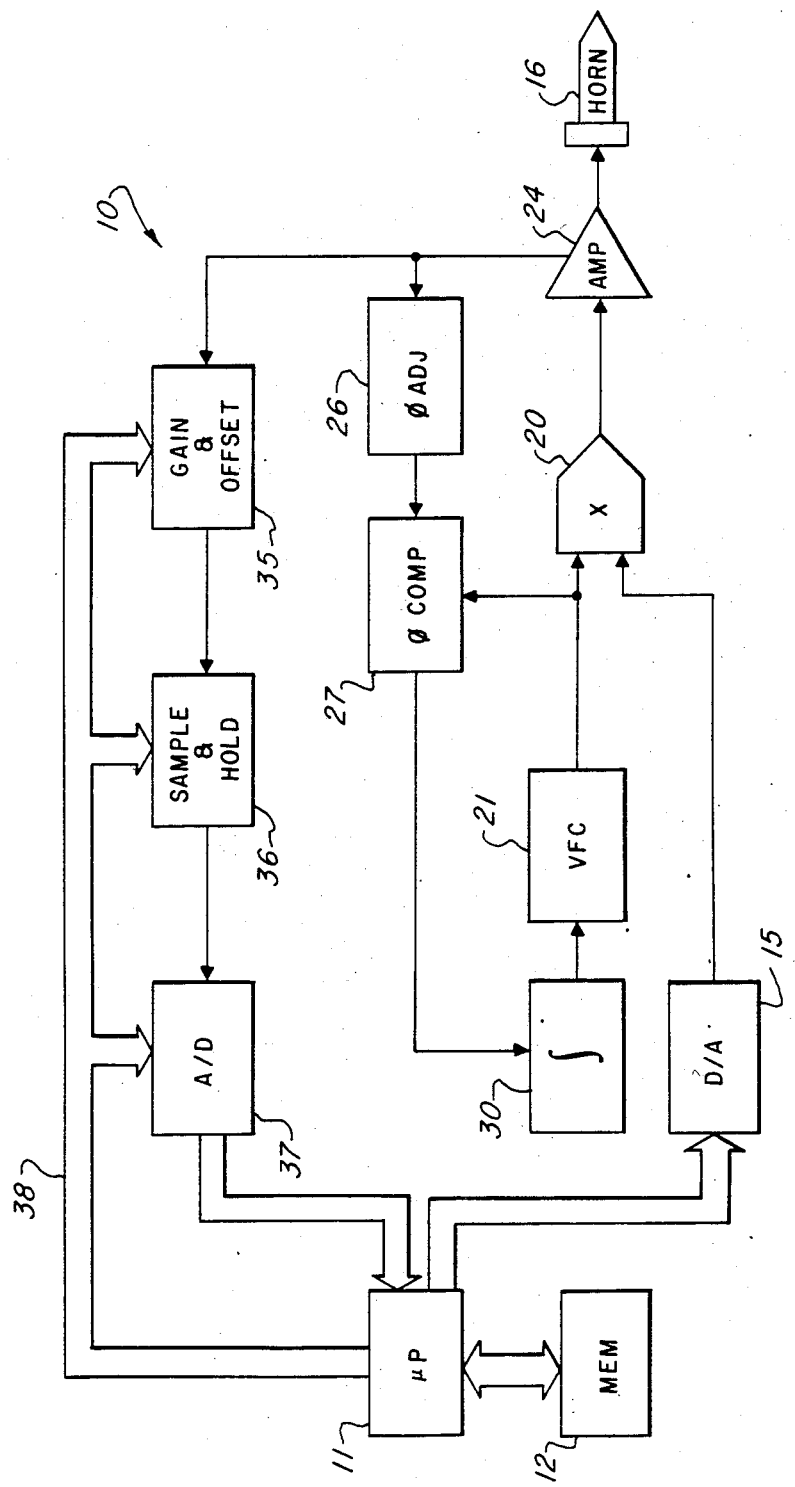
FIG. 3 is a block diagram of the programmable ultrasonic power supply, in accordance with the invention.

A block diagram of the programmable ultrasonic power supply in accordance with the invention is shown in FIG. 3. The ultrasonic power supply 10 is controlled by a general purpose microprocessor 11, which may be, for example, a type TMS9995, sold by Texas Instruments Incorporated of Dallas, Texas. The program for operating the power supply 10 is contained in a memory 12 associated with the microprocessor 11. The general details of the operation of a microprocessor and memory are well known in the art and are not described here in detail. An output bus from the microprocessor 11 is directed to a digital to analog converter 15 (variously referred to as a D to A or D/A converter) which, as will become apparent, produces an analog signal which is representative of the desired power amplitude to be applied to the bonding horn 16. The analog output of the D to A converter 15 serves as one input to an analog multiplier ("X")20. The other input to the analog multiplier 20 is provided by a voltage to frequency converter (VFC) 21, which has a generally triangular or sawtooth shaped output. The analog multiplier 20 serves to produce an output having the same triangle or sawtooth waveform shape produced by the voltage to frequency converter 21, only of amplitude determined by the amplitude output from the D to A converter 15. The analog multiplier 20, therefore, serves as a gain control to the signal produced by the voltage to frequency converter 21. The output from the analog multiplier 20 is conducted to a power amplifier 24, the output of which drives the bonding horn 16.

A digital feedback loop is provided, including a phase adjusting circuit (0ADJ)26, a phase comparator (0COMP)27, and a digital integrator 30. In operation, an output from the power amplifier 24 is derived or sensed which is proportional to the current delivered from the power amplifier 24 to the bonding horn 16. This current sensing signal is applied to the input of the phase adjusting circuit 26 to compensate for phase changes introduced in the phase lock and sensing circuitry. The output from the phase adjusting circuit 26 is applied to one input of the phase comparator 27, and the output from the voltage to frequency converter 21 is applied to the other input of the phase comparator 27. The phase comparator 27 serves to produce an output signal related to the phase difference between the phase adjusting circuit 26 and the voltage to frequency converter 21, the object being to minimize the phase difference between the two signals. (It should be noted that when the voltage and the current delivered to the bonding horn 16 are in phase, the horn is exactly tuned to its resonant frequency.) The output from the phase comparator 27 is connected to the input of the digital integrator 30 which integrates, positively or negatively, the phase difference to produce a voltage output proportional thereto. The output from the digital integrater 30 serves as the voltage input to the voltage to frequency converter 21; therefore, the frequency produced at the output of the voltage to frequency converter 21 is controlled by the digital phase lock loop circuitry to produce a drive signal to the ultrasonic horn 16 at its precise resonant frequency.

The current delivered to the ultrasonic bonding horn 16 is additionally fed back to the microprocessor 11 by a gain and offset control circuit 35, a sample and hold circuit 36, and an analog to digital converter 37 (variously referred to as an A to D or A/D converter). The gain and offset control circuit 35 is used to produce a signal which is in the processable range within the correct order of magnitude to the microprocessor, and to produce an output relatable to the current drive to the ultrasonic horn 16. The sample and hold circuit 36 at periodic intervals samples the output from the gain and offset circuit 35 and delivers the sample to the A to D converter 37 which converts the signal to digital form to be fed back to the microprocessor 11. The timing of the gain and offset circuit 35 and sample and hold circuit 36 is controlled by the microprocessor 11, by signals on line 38.

During the operation of the bonder, the bonding horn 16 is brought into contact with the location at which the first bond is to be made. (The bonding pads and lead film have been previously positioned with respect to the bonding apparatus by appropriate positioning means, not shown.) The contact between the bonding horn 16 and the bonding pad or lead film can be electronically detected since the impedance of the bonding horn will be changed slightly by the additional impedance presented by the bonding pad or lead film with which the horn is brought into contact. Thus, the current sensed from the power amplifier 24 which is fed back to the microprocessor 11 provides very accurate information regarding the contact of the bonding horn 16 and bonding pad. Additionally, as the bond is being formed, the impedance of the bond may change slightly. This change will result in a change in the current delivered from the power amplifier which will be reflected in a change in a counter (below described) forming a part of the digital integrator circuit 30. It can therefore be seen that the circuit 10 is self-tuning instantaneously during the formation of the bonds and from bond to bond as each is being formed. Furthermore, in the event of a gross bond malformation such as missing wire conditions, non-contact between the horn and bonding pad caused, for instance, by misalignment of the bonding pads, or like condition, the state of the bond is known immediately and an alarm or other flag can be generated by the microprocessor to alert the bonding operator of such condition.

Further, in the operation of the bonding circuit 10, as mentioned, the voltage to frequency converter 21 produces a sawtooth shaped voltage at its output to one of the inputs to the multiplier 20. Since the digital to analog converter 15 produces an analog signal to the other input of the multiplier 20 to produce a controlled output having the desired envelope waveform, the particular output waveform produced by the digital to analog converter 15 is as controlled by the microprocessor 11 in accordance with a preprogrammed or predetermined desired waveform pattern. The output from the multiplier 20 is then amplified by the power amplifier 24 and applied to the bonding horn 16.

Figure 1:
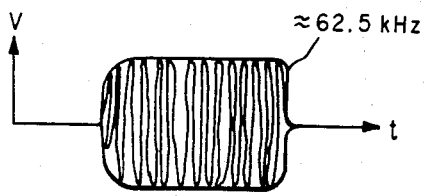
FIG. 1 is a plot of voltage versus time showing the voltage envelope waveform of a prior art power supply.
Figure 2:
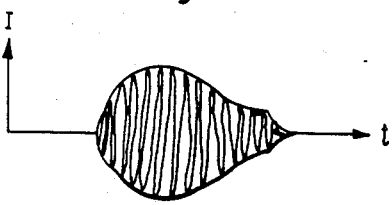
FIG. 2 is a plot of current versus time showing a typical current envelope waveform as may be seen by a prior art bonder power supply.
Figure 4:
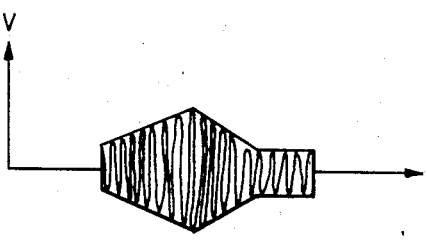
FIG. 4 is an envelope wave form of voltage versus time of a particular programmed signal delivered to an ultrasonic bonding horn, in accordance with the invention.
Figure 5:
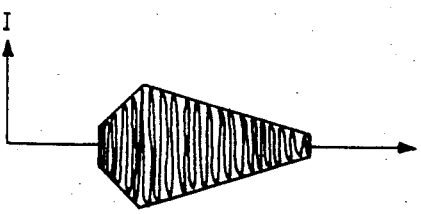
FIG. 5 is an envelope waveform of current versus time of a typical signal delivered to an ultrasonic bonding horn produced by the voltage signal of FIG. 5, in accordance with the invention.

With reference now to FIGS. 4 and 6, it can be seen that any arbitrary voltage waveform can be generated, merely by appropriate programming of the microprocessor 11. By way of example, the voltage waveform of FIG. 4 is shown having an initial trapezoidally increasing waveform pattern, followed by a trapezoidally decreasing waveform pattern, followed subsequently by a rectangular waveform pattern. Any other envelope waveform can be produced, as will be apparent to those skilled in the art. The current waveform which is produced also will be arbitrary for a particular applied voltage envelope, and will depend upon the particular static or changing impedances encountered during the bonding operations. As can be seen from FIG. 3, the current delivered to the bonding horn 16, being fed back to the microprocessor 11, also can be employed to dynamically control the envelope waveform of the applied current. Thus, not only can the bonder 10 be configured to apply a particular voltage waveform to the bonding horn 16, but because of the current feedback to the microprocessor, by dynamically controlling the voltage waveform it can be configured to apply any desired current waveform as well, even though the impedances in the bonding operations may be changing as the bonds or welds between the bonding tabs and lead wires are being formed. Additionally, as indicated above, by virtue of the phase comparing circuitry, the frequency of the voltage and current applied to the bonding horn 16 is continuously tuned to the resonant frequency of the bonding horn 16, despite fluctuations or variations in the impedances encountered during the bonding operations. It will be understood by those skilled in the art that since the current waveform is monitored, suitable means (not shown) can be provided for storing or maintaining a file of bond envelope waveform patterns against which each current pattern actually produced can be compared as it is being formed. A malformed pattern can therefore be used to trigger an alarm or other indication means (not shown) so that corrective action can be rapidly taken in the event of a malformed bond or the like.

Figure 6A:
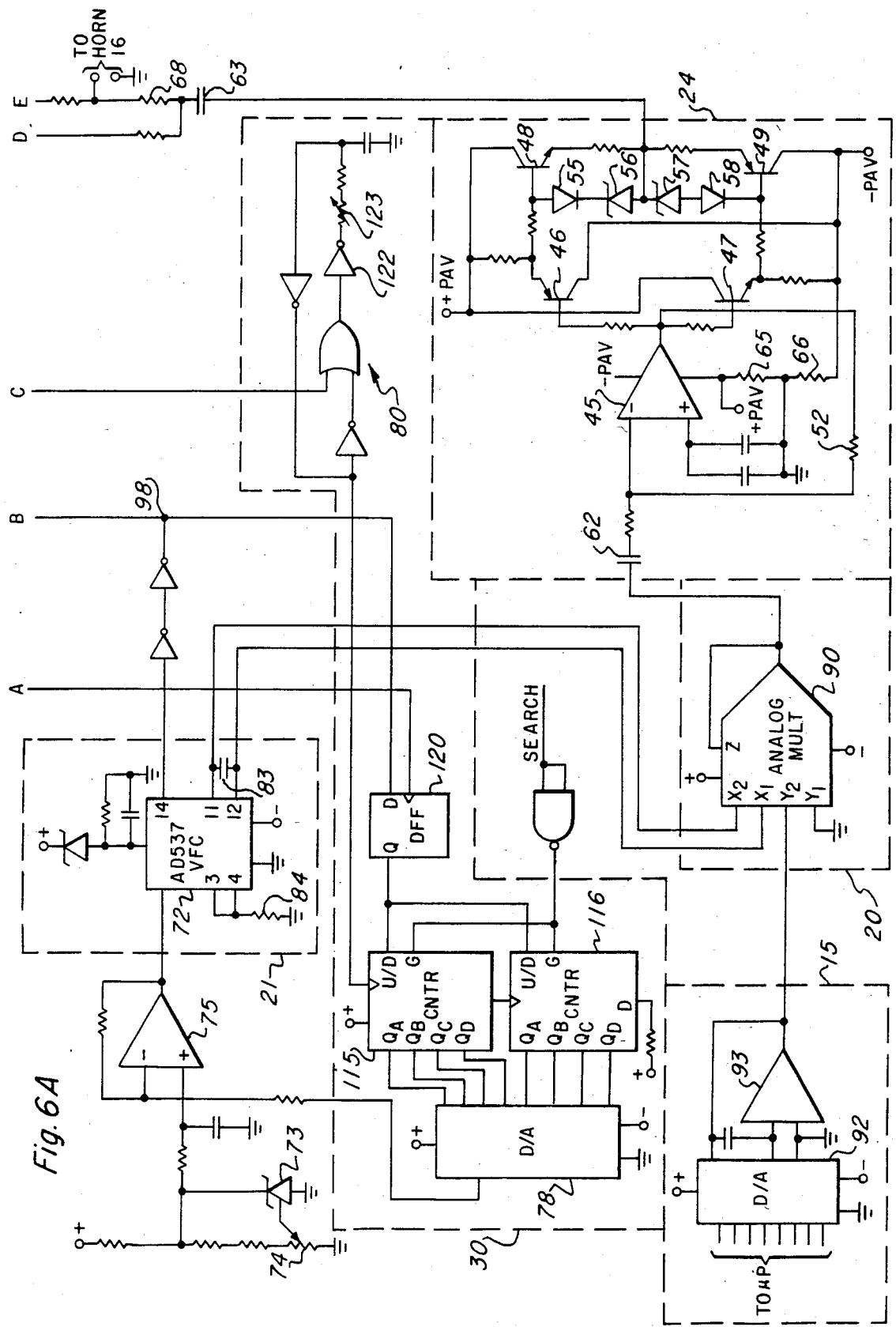
FIGS. 6A–6C is a schematic diagram of circuitry for accomplishing the bonder apparatus in accordance with the block diagram of FIG. 3.
Figure 6B:
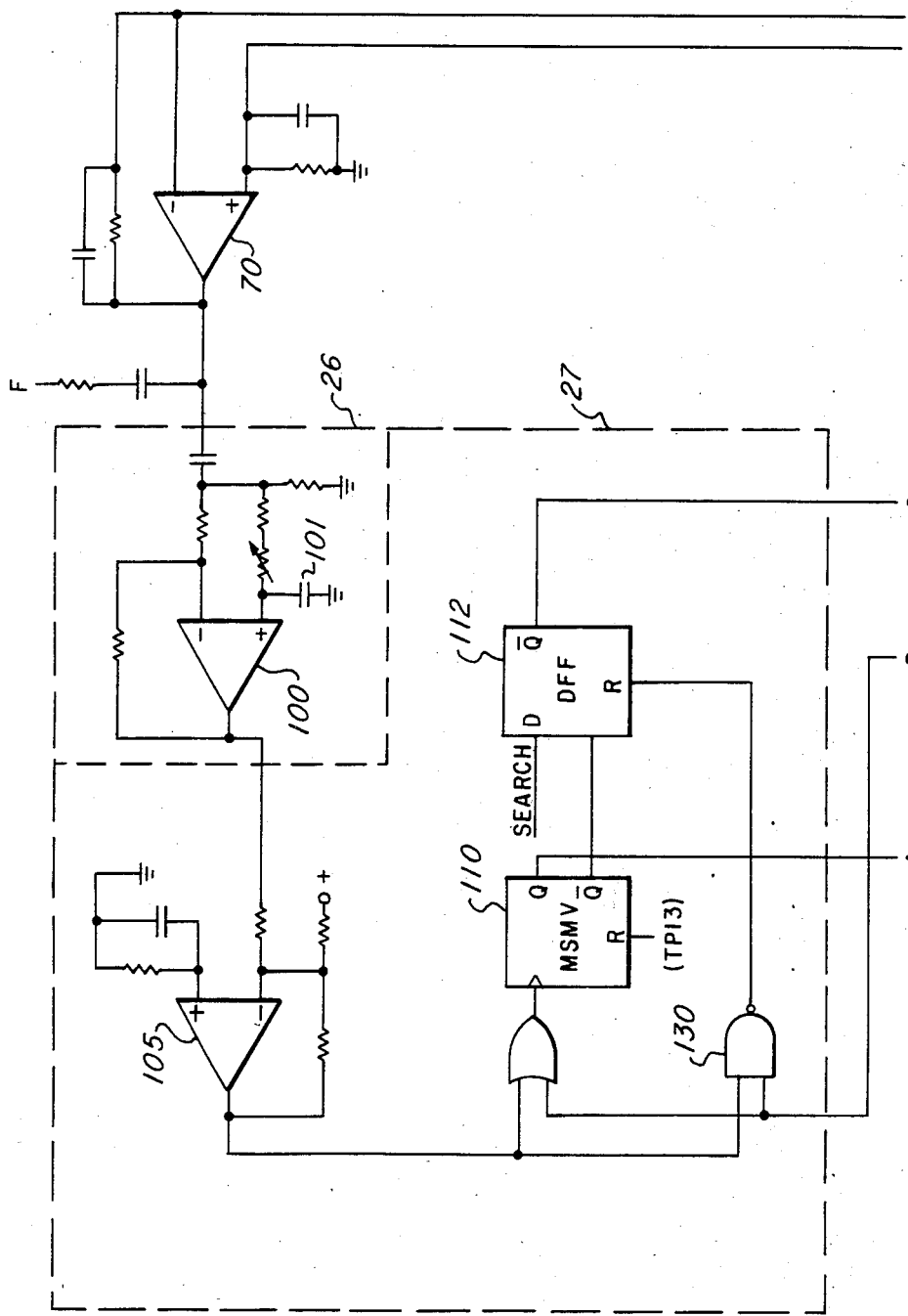
Figure 6C:
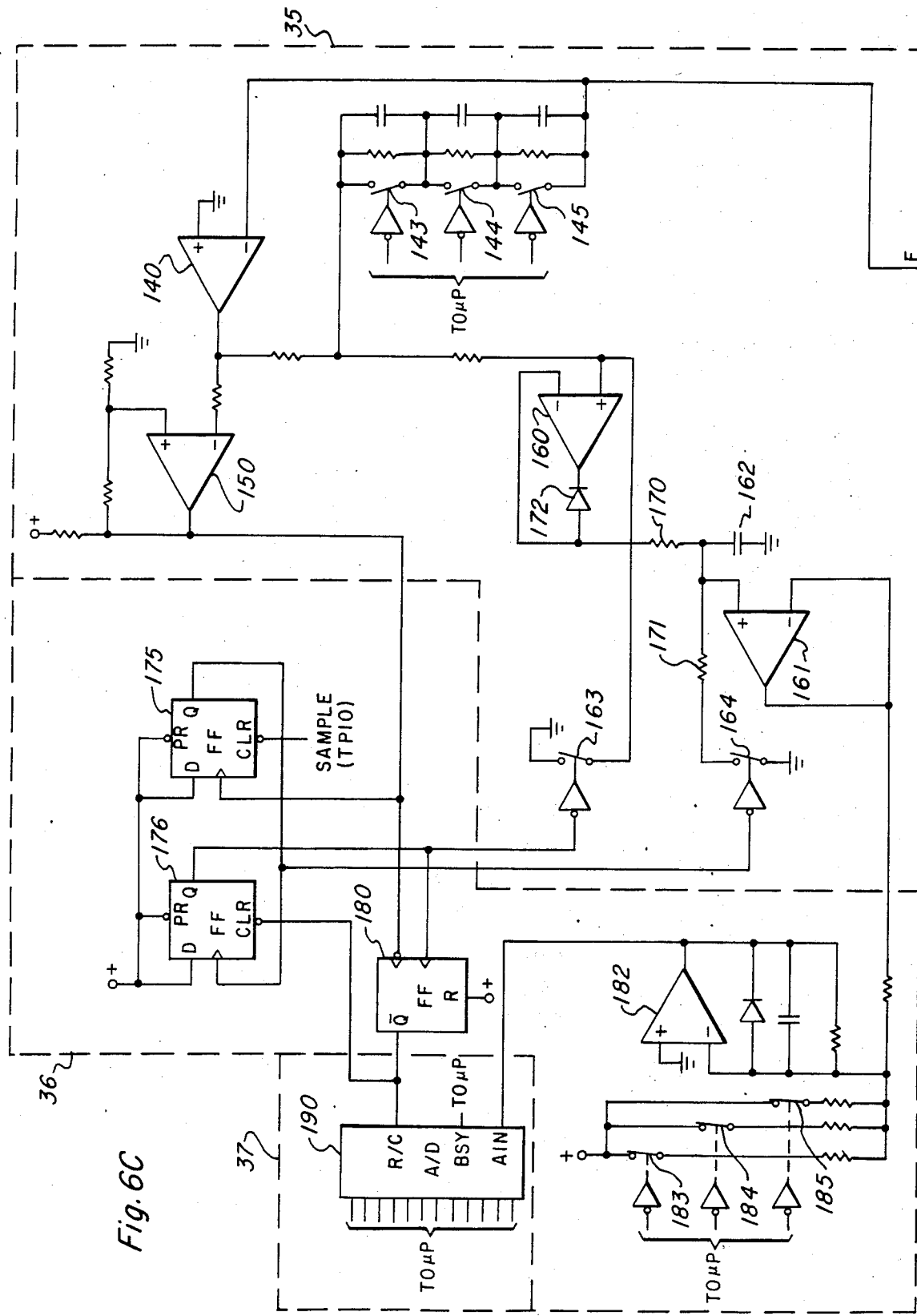

The details of a circuit for accomplishing the bonding apparatus in accordance with the block diagram of FIG. 3 and in accordance with a preferred embodiment of the invention is shown in detail in FIGS. 6A–6C, the interconnections between the various figures of the drawing being indicated by letters A–F.

As mentioned the programmable ultrasonic power supply in accordance with the invention uses a microprocessor, such as a TMS 9995. It directly communicates to a memory within which is contained its operating program, as below described in detail. With reference now to the schematic diagram of FIGS. 6A–6C, the power amplifier 24 is made up of an operational amplifier 45 and four transistors 46–49. The transistors 46–49 form a voltage following current amplifier with feedback to the operational amplifier through a resistor 52. Diodes 55–58 cause the output to be current limited, for example, at about 1 amp peak, in case of an output short.

The power amplifier 24 is isolated from the rest of the circuit by capacitors 62 and 63. Power for the power amplifier circuit is indicated at +PAV and −PAV. These voltages may be of appropriate levels depending upon the particular components employed in fabricating the circuit. The reference for the operational amplifier 45 is set to a level half way between +PAV and −PAV by divider resistors 65 and 66. The ultrasonic horn 16 (FIG. 3) is connected across a current sensing resistor 68.

An operational amplifier 70 (FIG. 6B), connected as a differential amplifier, is provided to amplify the sensed current for use in both current feedback paths for controlling the phase and amplitude of the applied power pulses to the ultrasonic horn.

A voltage to frequency converter 72 (FIG. 6A) is the heart of the tuning circuit. A diode 73 and resistor 74 provide a course adjustment for the voltage input of the voltage to frequency converter 72 by offsetting the amplifier 75, and fine adjustment is provided from a digital to analog converter 78. The digital information to the digital to analog converter 78 is from the two up/down counters 115 and 116, which are counted in the appropriate direction by the tuning clock 80 (about 2 MC). It should be noted that the counters are enabled to count only when 'SEARCH' is high, the 'SEARCH' signal being generated by the microprocessor 11. A capacitor 83 and resistor 84 determine the ratio of frequency output (Fo) to voltage input (Vi). The equation for this is:

$$Fo = Vi/(10.5(R84)(C83))$$

Thus, the waveform that appears across the capacitor 83 is a triangle wave which is applied to the X differential inputs of an analog multiplier 90. The Y inputs receive the gain signal from the digital to analog converter circuit 15. This results in a 0-10 volt level produced by an 8-bit digital to analog converter 92 and operational amplifier 93, according to the programmed microprocessor 11. The output of the multiplier 90 then, is a triangle wave with gain which is set by software, and which is applied to the power amplifier 24. Although the wave form which powers the ultrasonic horn is a triangle wave, since the Q of the horn is so high, only the fundamental frequency (62-63 KC) is converted to energy. This means that the current in the horn will be sinusoidal.

The voltage representation of the current appearing at the output of the amplifier 70 will be a sine wave which is shifted approximately −23 degrees from actual current due to the low pass filter inherent to the circuit configuration of the amplifier 70. For optimum efficiency the drive to the horn should be at the resonant frequency of the transducer. When this occurs, the bonding current is observed to be exactly in phase with the drive voltage. It is the function of the current feedback circuit to make these two signals be in phase, thus tuning the drive to the resonance of the horn.

Pin 14 of the V/F converter 72 is an open collector output which changes state at each peak of the triangle wave across the capacitor 83. This means that the signal at node 98 will be a square wave which is very close to 90 degrees lagging out of phase with the output triangle wave. Since this is one of the signals used for phase comparison it is necessary that a signal be derived which is very close to the lagging current wave form. The current being sinusoidal, an adjustable all pass filter formed by amplifier 100 and resistor 101 may be used to shift the signal at the output of amplifier 70 an additional −67 degrees from the −23 already there due to amplifier 70. A comparator 105 converts this to a TTL square wave so that the necessary signals to compare voltage and current phsae are present at the output of amplifier 105 and node 98.

It is assumed that the gain signal at the output of amplifier 93 is about 5 volts. Thus, during part of each cycle, both the output of amplifier 105 and the voltage at node 98 will be low. If the voltage and current are in phase the signals at these test points will go high at the same time. However, if they are not in phase, one will go high first. When one of these signals goes high, a one-shot multivibrator 110 will be triggered and the Q output will go high, for instance, for roughly 200 nsec. This will trigger a D flip-flop 112 will then apply whatever level appears at node 98 to the up/down inputs of a pair of up/down counters 115 and 116.

At the end of the 200 nsec the Q output of the one shot multivibrator 110 will return to a high state triggering another D flip-flop 120. This will cause the Q output of that device to go low, allowing the clock 80, adjustable due to the operation of amplifer 122 and variable resistor 123, to appear at the clock inputs of the up-/down counter 115. If the 'SEARCH' signal is high, the counters will count in the direction which will cause the difference between the current and voltage phases to decrease.

When the other of the phase signals goes high at either the output of amplifier 105 or at node 98, after the signal developed from node 98 by a NAND gate 130 will cause the clear input of the D flip-flop 112 to be pulled low, thus bringing as Q output back high, and removing the tuning clock from the up/down counters 115 and 116. This means that the counters are only allowed to change output during the time between when one of the phase signals goes high and the time that the other goes high. As this time decreases until this time becomes less than the 200 nsec 'dead band' created by the one shot 110. When this situation occurs, the D flip-flop 112 is cleared before the end of the one shot time period, so the Q output stays low and the counters receive no more tuning clocks.

The current amplitude signal at the output of amplifier 70 is also applied to an amplifier 140 (FIG. 6C) which is used in a multi-gain configuration with three analog switches 143-145. This gain is programmable in 8 increments from 1 to 8 with three bits from the microprocessor 11. A comparator 150 has an output which is a square wave 180 degrees out of phase with the amplified current signal.

Amplifiers 160 and 161 along with a capacitor 162, and the two separated analog switches 163 and 164 make a peak detector. When the 'SAMPLE' signal is low, both switches 163 and 164 will be closed. The output of amplifier 160 will be at ground potential and will be kept out of saturation by pulling current from the +5 volts supply through resistors 170 and 171, and a diode 172. When the 'SAMPLE' signal from the microprocessor 11 goes high, a first D flip-flop 175 will be allowed to trigger on the next positive edge from the comparator 150. When this occurs, Q will go high causing the analog switch 164 to open and a second flip-flop 176 to also trigger. This opens the switch at 163 and enables a one shot multivibrator (MV) 180 to trigger as the output from amplifier 150 goes low.

The time while the output from the amplifier 150 is high and both switches 163 and 164 are open corresponds to the negative half of the sinusoidal signal at the output of amplifier 140. As long as this signal is going more negative, diode 172 will continue to be forward biased and will continue to charge capacitor 162 with a negative voltage. However, when the voltage heads back toward zero, the output of amplifier 150 will slam off to the positive rail and capacitor 162 will have the peak negative voltage stored at the positive input of amplifier 161. Since amplifier 161 is a voltage follower, this voltage will also appear at the amplifiers output. The final operational amplifier 182 is configured with the three switches 183, 184 and 185 as a unity gain inverting operational amplifier with multiple offset capability. Offset may be applied in 8 one volt increments using three bits specified by the microprocessor 11. The output of amplifier 182 is applied to the input of an analog to digital converter 190.

When the flip-flop 175 triggers (5usec) at the end of the negative half of the sinusoid, the low going Q output causes the second flip-flop 176 to be cleared, which in turn closes switch 163 and starts the sample cycle in the analog to digital converter 190 by pulsing its R/C input. Closing switch 163 disallows any more negative peaks reaching capacitor 162 during the remainder of the sample cycle. The analog to digital converter 190 takes between 15 and 25 micro seconds to complete the conversion after which it will set the 'busy' line low ('busy' goes high when the conversion begins). This may be observed by the microprocessor 11. The microprocessor 11 must then set the 'SAMPLE' signal low before starting another sample cycle.

Figure 7A:
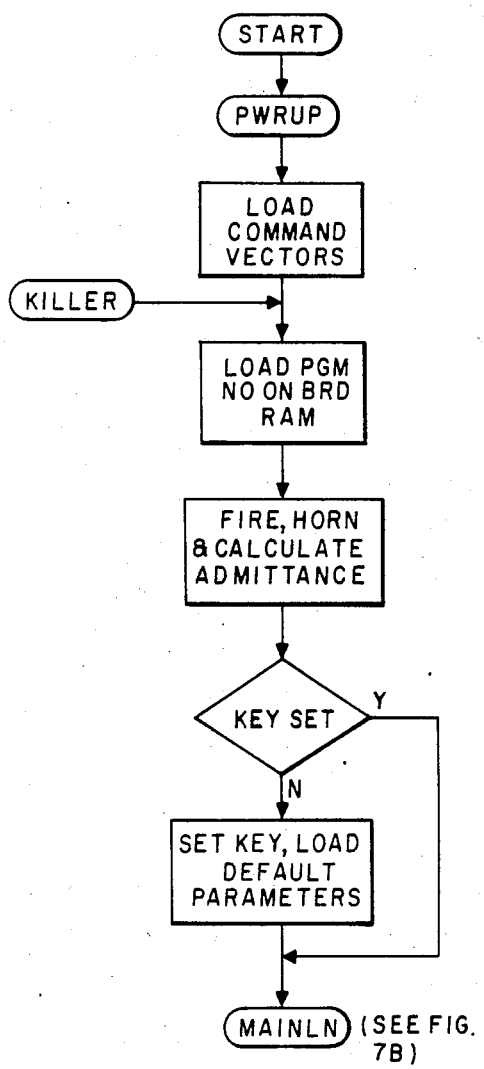
FIGS. 7A through 7Q is a flow diagram for a computer program for operating the programmable ultrasonic power supply in performing wire lead bonding, in accordance with the invention.
Figure 7B:
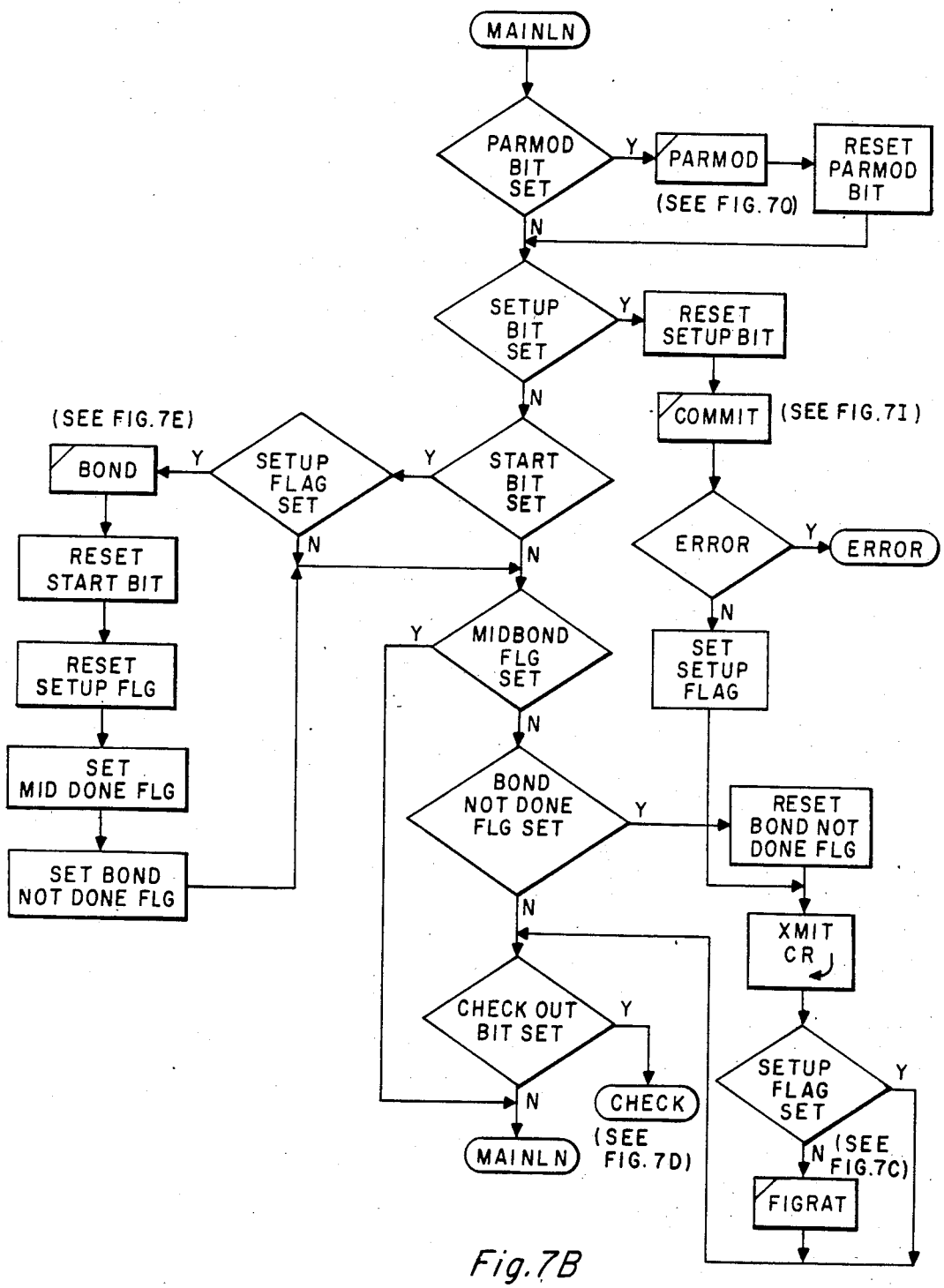
Figure 7C:
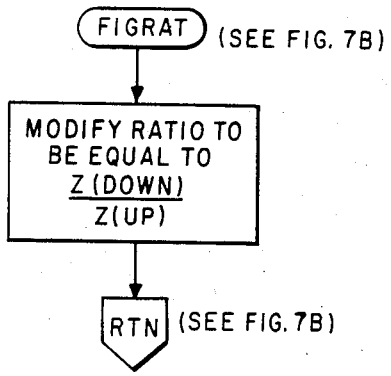
Figure 7D:
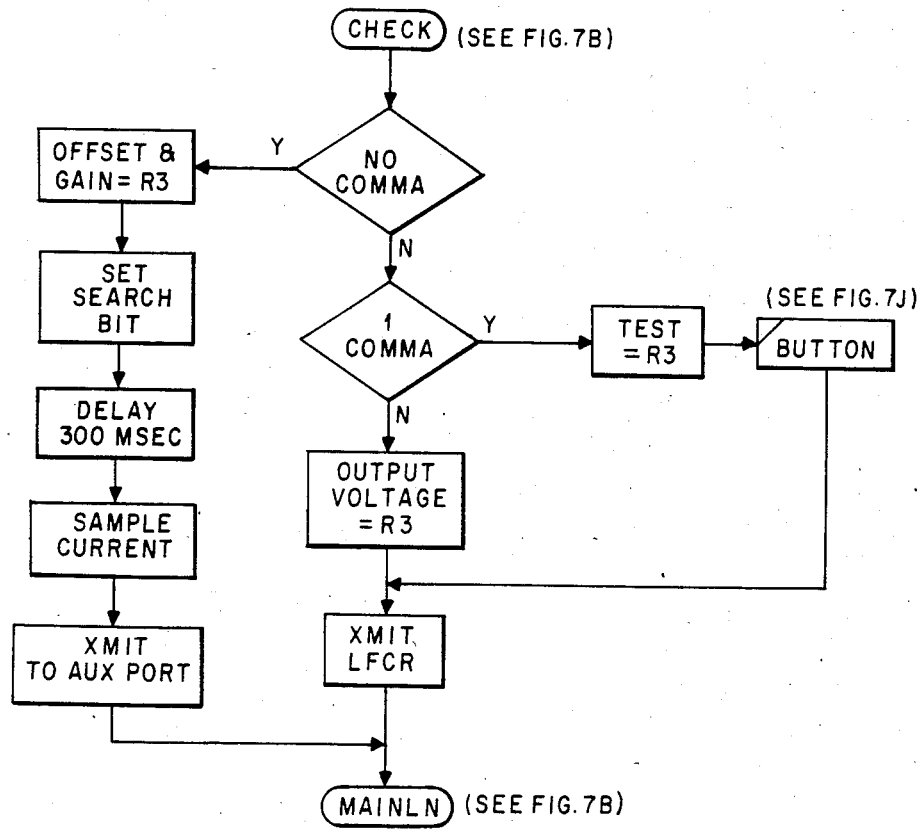
Figure 7H:
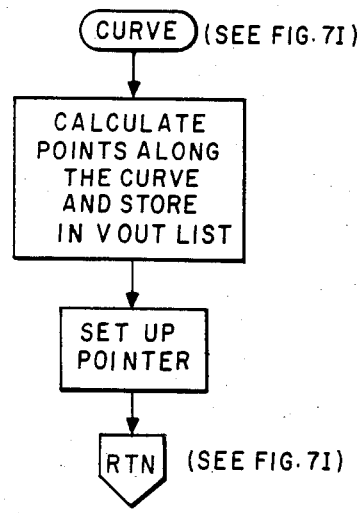
Figure 7E:
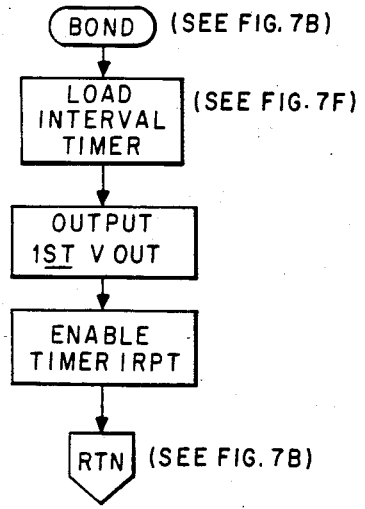
Figure 7G:
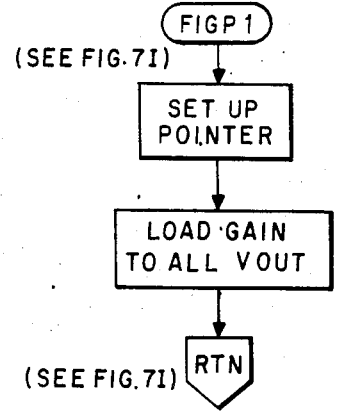
Figure 7F:
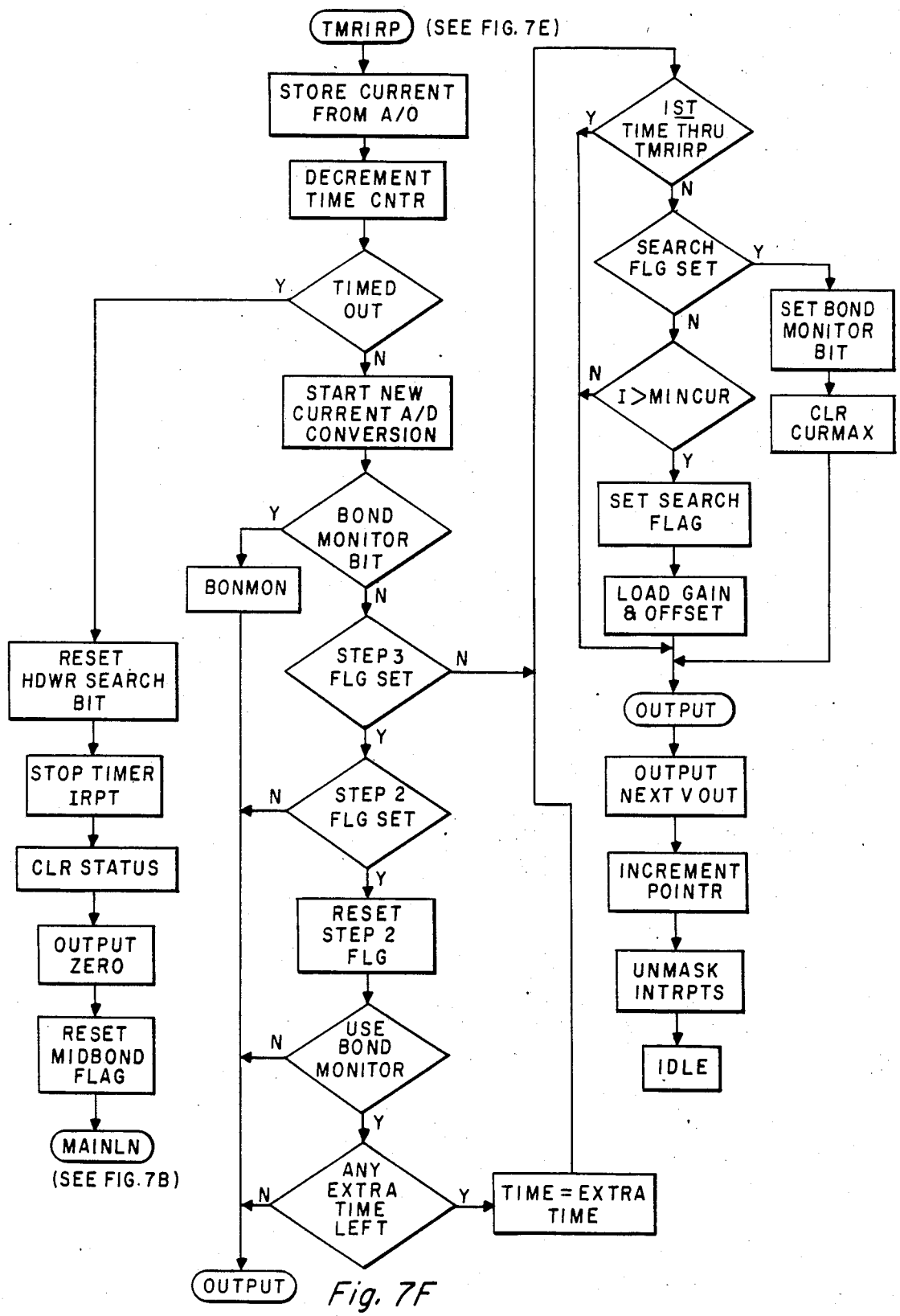
Figure 7I:
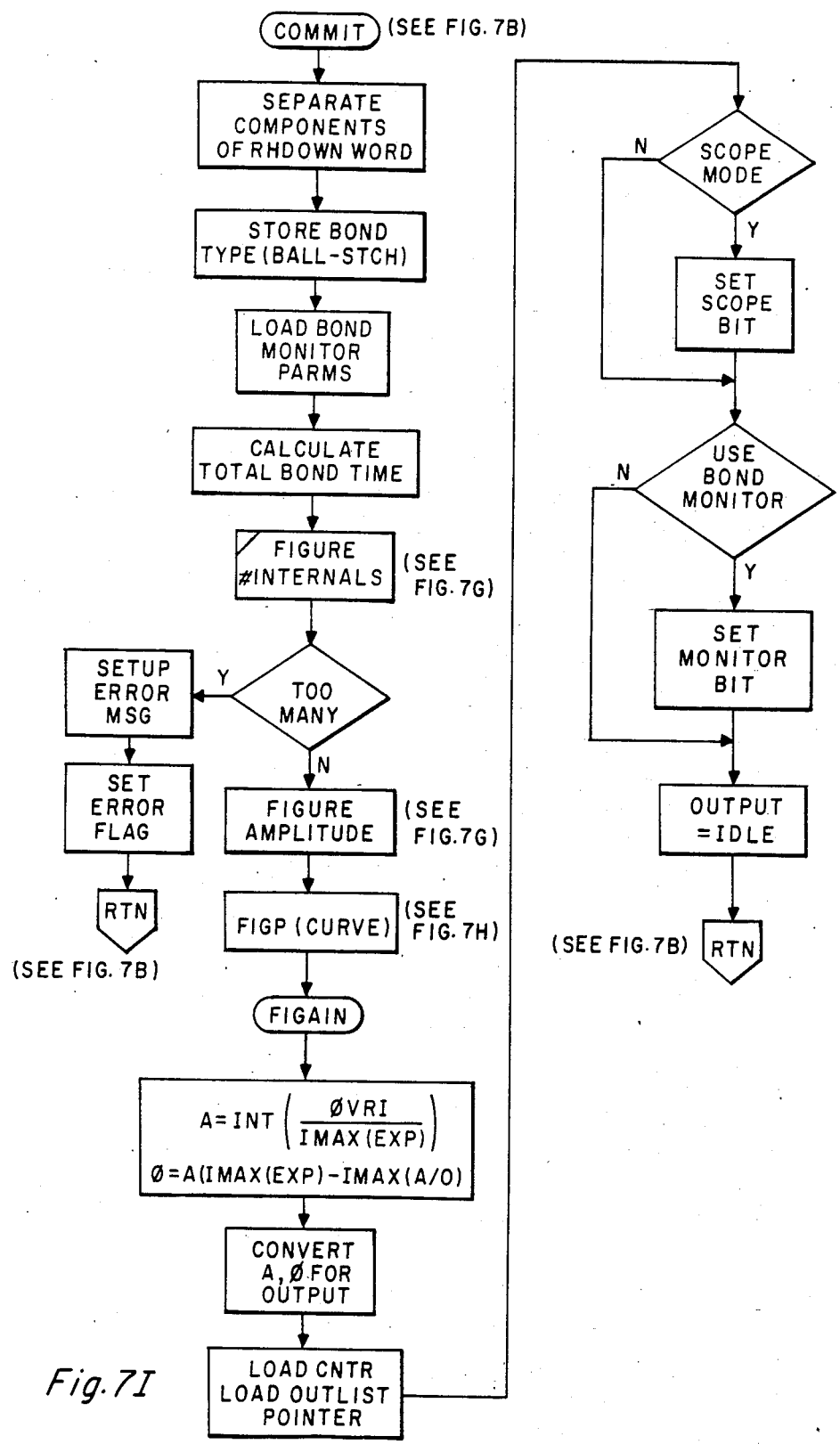
Figure 7J:
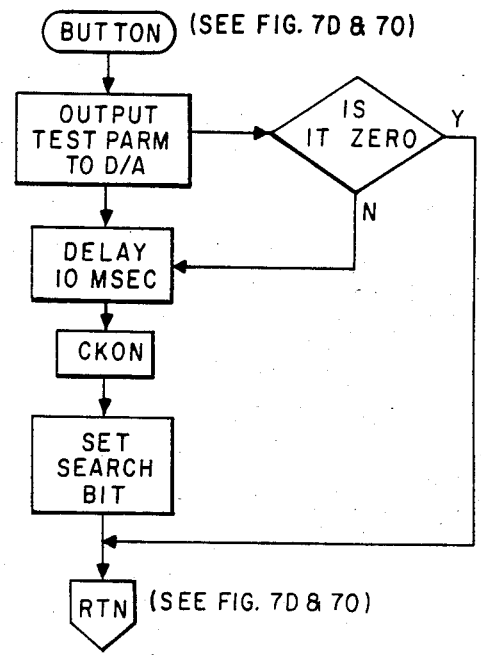
Figure 7K:
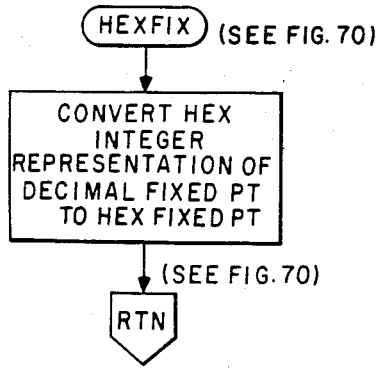
Figure 7L:
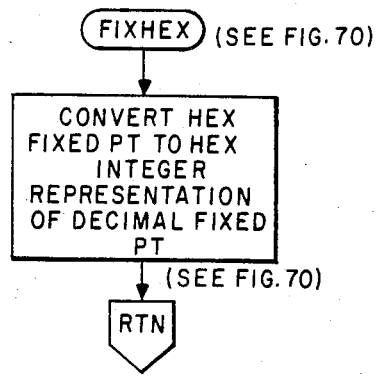
Figure 7M:
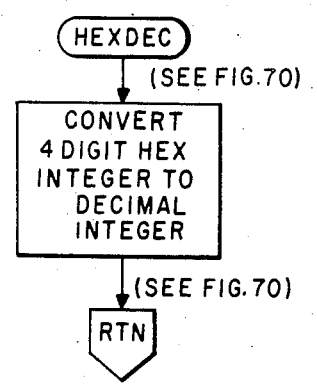
Figure 7N:
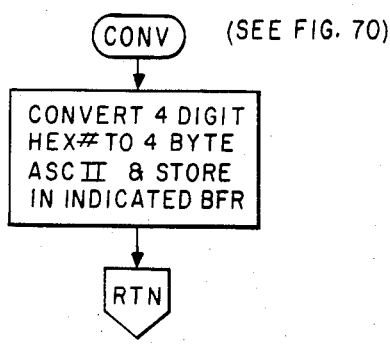
Figure 7P:
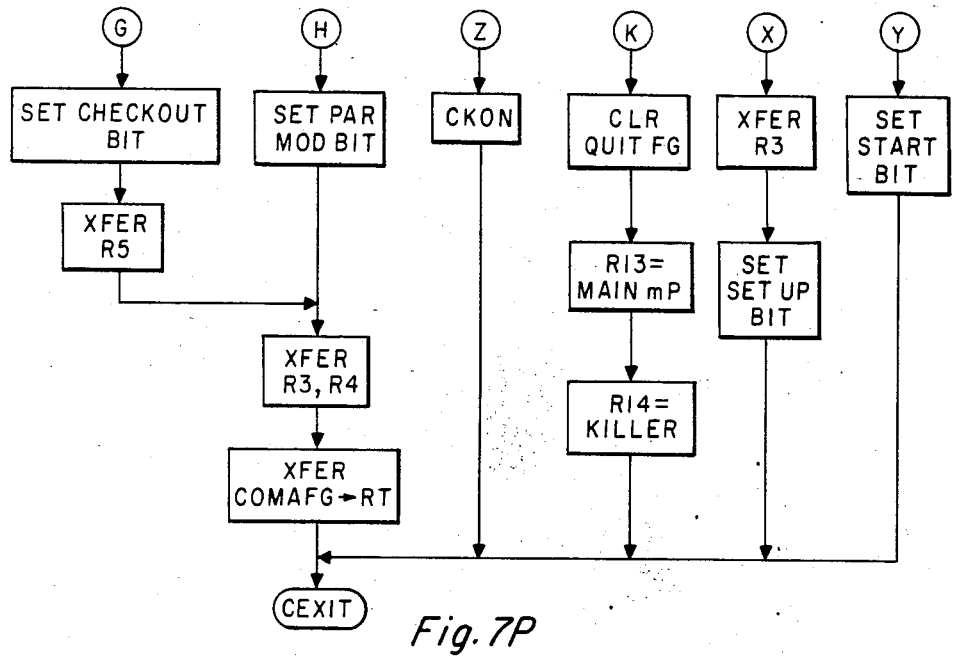
Figure 7Q:
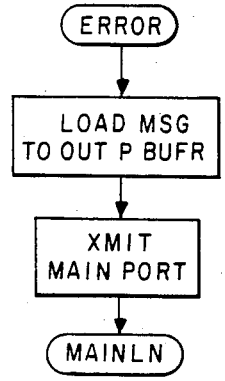
Figure 70:
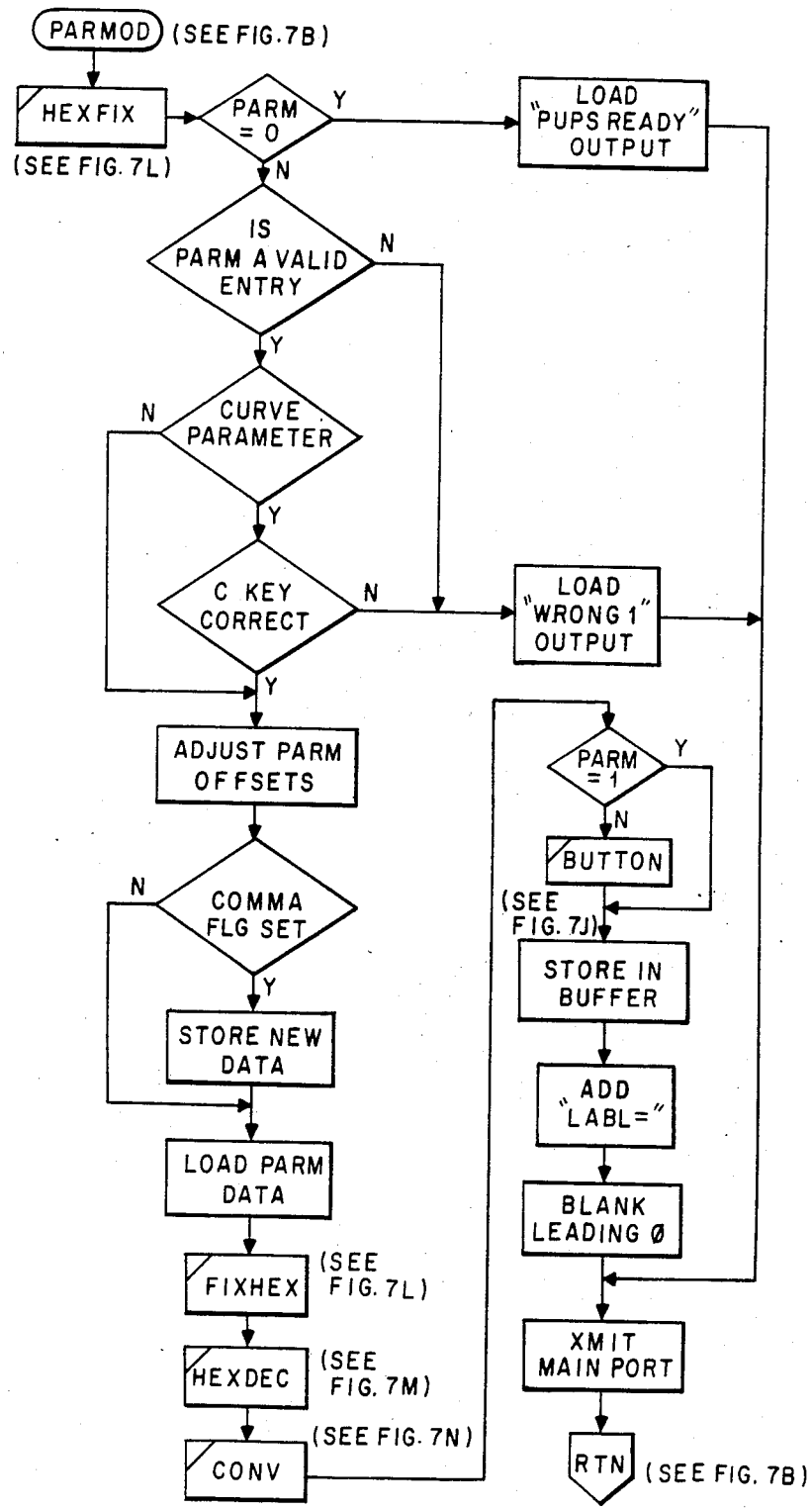

With the bonder circuit 10 formed as above described and illustrated, the microprocessor 11 can be programmed to control the bonding operations as needed. A flow chart showing the various program steps which may be employed in the operation of the microprocessor 11 are shown in FIGS. 7A–7Q, and are not described herein further in detail, it being within the skill of the art for the implementation of a computer program following the steps set forth in the flow chart.

Although the invention has been described and illustrated with a certain degree of particularlity, it is understood that the present disclosure has been made by way of example only and that numerous changes in the combination and arrangement of parts may be resorted to by those skilled in the art without departing from the spirit and the scope of the invention as hereinafter claimed.

What is claimed is:

1. A generator for providing ultrasonic power to a wire bonder for connecting wires from locations on an integrated circuit to locations on a lead frame carrying said integrated circuit, comprising:
   means for generating ultrasonic power for application to said bonder having voltage and current envelope waveforms dynamically controllable during formation of a bond to have one of a plurality of different, predetermined shapes, and
   programmed digital computer means for continuously controlling during formation of the bond at least the amplitude of at least said voltage envelope waveform to have one of a plurality of different, predetermined shapes.

2. The generator of claim 1 wherein said means for continuously controlling at least the amplitude of at least said voltage waveform comprises means fof continuously sensing said current envelope waveform, and means responsive to said sensed current envelope waveform to control during formation of the bond at least the amplitude of said voltage envelope waveform to conform said current envelope waveform to a predetermined envelope waveform pattern.

3. The generator of claim 2 wherein said bonder comprises a horn having a resonant frequency which changes during bonding, and said generator further comprises means for continuously and automatically adjusting the frequency of said applied ultrasonic power to be said changing resonant frequency.

4. A bonder in which ultrasonic power is applied to a bonding horn, comprising:
   means for applying a voltage at an ultrasonic frequency and having a waveform with a shape dynamically controllable during formation of a bond to have one of a plurality of different, predetermined shapes to the bonding horn to produce a bonding current in said horn;
   means for continuously monitoring the bonding current in the bonding horn;
   and means for maintaining a zero phase difference between the applied voltage and the monitored current.

5. The bonder of claim 4 wherein said means for maintaining a zero phase difference comprises:
   means for comparing the phase of the applied voltage and the monitored current to produce a phase difference signal;
   means responsive to the phase difference signal for changing the frequency of the applied voltage to bring it into phase with the monitored current.

6. The bonder of claim 5 wherein said means responsive to the phase difference for changing the frequency of the applied voltage comprises:
   an integrator for receiving the phase difference signal and for producing a voltage output related to the phase difference signal;
   and a voltage to frequency converter responsive to the output of said integrator to produce an applied voltage signal having zero phase difference from said monitor to current.

7. The bonder of claim 6 wherein said phase comparing means includes means for adjusting the phase of the monitored current to eliminate any phase contribution thereto by the bonder circuitry.

8. The bonder of claim 4 wherein said means for continuously monitoring the bonding current applied to the bonding horn comprises a programmed digital computer.

9. The bonder of claim 8 wherein said programmed digital computer produces a voltage envelope waveform of a predetermined configuration.

10. The bonder of claim 8 further comprising means for providing a signal to said programmed digital computer representative of the monitored current.

11. The bonder of claim 10 wherein said means for providing a current respresentative signal comprises a sample and hold circuit for receiving the monitored current signal and an A to D converter for producing a digital signal from the sample signal produced by the sample and hold circuit.

12. The bonder of claim 11 wherein said programmed digital computer compares the monitored current signal to predetermined bond profiles for determining the integrity of the bond formed.

13. A bonder in which a voltage at an ultrasonic frequency is applied to a bonding horn comprising:
   a voltage generator for delivering a voltage to said horn at an ultrasonic frequency having a waveform wih a shape dynamically controllable during formation of a bond to have one of a plurality of different, predetermined shapes;
   and programmed digital computer means for continuously controlling the envelope waveform of the delivered voltage.

14. The bonder of claim 13 wherein said voltage generator comprises:
   a frequency generator for generating a signal at the ultrasonic frequency applied to the bonding horn;
   a digital to analog converter for producing an amplitude signal under the control of the programmed digital computer for determining the amplitude of the voltage applied to the bonding horn;
   and means for producing a voltage having the frequency of the frequency generator and amplitude determined by the digital to analog converter for application to said bonding horn.

15. The bonder of claim 14 wherein said means for producing a voltage comprises:
   a multiplier for multiplying the frequency produced by said frequency generator by the amplitude produced by said digital to analog converter to produce a first voltage signal;

and a power amplifier to which said first voltage signal is applied for producing a bonding voltage.

16. The bonder of claim 15 further comprising means for sensing a current delivered to said bonding horn;

and means for producing a feedback signal to said programmed digital computer representative of the sensed current.

17. The bonder of claim 16 wherein said programmed digital computer contains program means for comparing the current feedback representative signal to known current profiles for controlling the integrity of bonds made by the bonder.

18. The bonder of claim 16 further comprising means for equalizing the phase of the delivered voltage with a phase of said sensed current to said bonding horn for precisely tuning the power delivered to said bonding horn to a resonant frequency thereof.

19. The bonder of claim 18 wherein said phase controlling means comprises means for varying the frequency of said frequency generator in according with the phase difference between said voltage and said current.

* * * * *